United States Patent
Ikku et al.

(10) Patent No.: US 11,610,816 B2
(45) Date of Patent: Mar. 21, 2023

(54) PROCESSING METHOD OF WAFER

(71) Applicant: DISCO CORPORATION, Tokyo (JP)

(72) Inventors: Yuki Ikku, Tokyo (JP); Shuichiro Tsukiji, Tokyo (JP); Satoshi Kobayashi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 304 days.

(21) Appl. No.: 17/171,138

(22) Filed: Feb. 9, 2021

(65) Prior Publication Data
US 2021/0265210 A1  Aug. 26, 2021

(30) Foreign Application Priority Data
Feb. 21, 2020  (JP) .............................. JP2020-028750

(51) Int. Cl.
| H01L 21/78 | (2006.01) |
| H01L 21/268 | (2006.01) |
| B23K 26/00 | (2014.01) |
| B23K 26/0622 | (2014.01) |
| B23K 26/53 | (2014.01) |
| B23K 26/03 | (2006.01) |
| B23K 101/40 | (2006.01) |

(52) U.S. Cl.
CPC .......... *H01L 21/78* (2013.01); *B23K 26/0006* (2013.01); *B23K 26/032* (2013.01); *B23K 26/0622* (2015.10); *B23K 26/53* (2015.10); *H01L 21/268* (2013.01); *B23K 2101/40* (2018.08)

(58) Field of Classification Search
CPC ............... H01L 21/268; H01L 21/3043; H01L 21/67092; H01L 21/67132; H01L 21/78; B23K 26/0006; B23K 26/032; B23K 26/0622; B23K 26/53
See application file for complete search history.

(56) References Cited

U.S. PATENT DOCUMENTS

| 2015/0303113 A1* | 10/2015 | Sekiya | ................... H01L 21/78 438/462 |
| 2016/0111331 A1* | 4/2016 | Ogawa | .............. H01L 21/67092 438/113 |
| 2016/0380605 A1* | 12/2016 | Matsumoto | ........ B23K 26/0006 225/2 |

FOREIGN PATENT DOCUMENTS

| JP | 2005086161 A | 3/2005 |
| JP | 2010068009 A | 3/2010 |

* cited by examiner

*Primary Examiner* — Brook Kebede
(74) *Attorney, Agent, or Firm* — Greer Burns & Crain Ltd.

(57) ABSTRACT

A processing method of a wafer in which a modified layer is formed inside the wafer. In the processing method, irradiation with a first laser beam is executed from a back surface side of the wafer and the modified layer is formed inside the wafer. Then, irradiation with a second laser beam is executed with the focal point thereof positioned to the inside or the front surface of the wafer and reflected light is imaged by an imaging unit. Furthermore, a processing state of the wafer is determined on the basis of a taken image. The second laser beam is shaped in such a manner that a sectional shape thereof in a surface perpendicular to a traveling direction thereof becomes asymmetric across the modified layer.

6 Claims, 11 Drawing Sheets

PROCESSING METHOD OF WAFER

BACKGROUND OF THE INVENTION

Field of the Invention

The present invention relates to a processing method of a wafer in which irradiation with a laser beam is executed from a back surface side of the wafer and this laser beam is focused inside the wafer to form a modified layer that becomes a point of origin of dividing the wafer and a crack is extended from this modified layer to a front surface side of the wafer.

Description of the Related Art

In a manufacturing step of device chips, plural planned dividing lines that intersect each other are set on a front surface of a wafer and a device is formed in each region marked out, and the wafer is divided along the planned dividing lines. For example, the wafer is irradiated with a laser beam with a wavelength having transmissibility with respect to the wafer (wavelength that allows transmission through the wafer) from a back surface side of the wafer and the laser beam is focused inside the wafer along the planned dividing line. At this time, a modified layer that serves as the point of origin of dividing is formed in the vicinity of a focal point of the laser beam. When a crack extends from the formed modified layer to the front surface of the wafer, the wafer is divided along the planned dividing line (for example, refer to Japanese Patent Laid-open No. 2005-86161 and Japanese Patent Laid-open No. 2010-68009). In this processing method, processing conditions such as the formation position of the modified layer in the depth direction of the wafer and the irradiation condition of the laser beam need to be properly set so that the modified layer may be formed and the crack may progress from this modified layer toward the front surface of the wafer. If the processing conditions or the like are not proper, the crack does not properly extend from the formed modified layer or the crack extends in a direction that is not planned, or the like, and it is impossible to properly divide the wafer. Therefore, the yield of the device chips lowers.

SUMMARY OF THE INVENTION

Here, it is conceivable that the front surface of the wafer is observed by a microscope or the like, for example, in order to check whether or not the processing conditions or the like are proper, i.e., whether or not the crack properly progresses from the modified layer formed in the wafer toward the front surface of the wafer. However, to observe the front surface side of the wafer irradiated with the laser beam from the back surface side, for example, the wafer needs to be taken out from a laser processing apparatus and be carried in to the microscope or the like with the wafer turned upside down. For this reason, there is a problem that man-hours are required for the check of the formation situation of the crack.

Thus, an object of the present invention is to provide a processing method of a wafer in which whether or not the wafer has been properly processed can be easily checked.

In accordance with an aspect of the present invention, there is provided a processing method of a wafer in which a modified layer is formed inside the wafer on which a plurality of planned dividing lines are set on a front surface along the planned dividing lines of the wafer. The processing method includes a holding step of causing the front surface of the wafer to be opposed to a chuck table and holding the wafer by the chuck table and a modified layer forming step of positioning a focal point of a first laser beam with a wavelength having transmissibility with respect to the wafer to the inside of the wafer and executing irradiation with the first laser beam along the planned dividing lines from the side of a back surface of the wafer while relatively moving a laser beam irradiation unit and the chuck table in a direction along the planned dividing line, to form the modified layer inside the wafer. The processing method includes also an observation laser beam irradiation step of positioning a focal point of a second laser beam with output power that does not exceed a processing threshold of the wafer and with a wavelength having transmissibility with respect to the wafer to the inside or the front surface of the wafer and executing irradiation with the second laser beam from the side of the back surface of the wafer after the modified layer forming step, an imaging step of imaging reflected light of the second laser beam with which the irradiation is executed in the observation laser beam irradiation step by an imaging unit, and a determination step of determining a processing state of the wafer on the basis of an image taken in the imaging step. The second laser beam with which the wafer is irradiated in the observation laser beam irradiation step is shaped in such a manner that a sectional shape of the second laser beam in a surface perpendicular to a traveling direction of the second laser beam becomes asymmetric across the modified layer.

Preferably, in the determination step, it is determined that a crack extends from the modified layer toward the side of the front surface of the wafer when the reflected light appears in such a manner as to overlap with a region with the same shape as a region irradiated with the second laser beam with which the wafer is irradiated in the observation laser beam irradiation step in the back surface in the image taken in the imaging step, and it is determined that the crack does not extend from the modified layer toward the side of the front surface of the wafer when the reflected light appears in such a manner as to overlap with a region with a shape obtained by inverting a shape of the region irradiated with the second laser beam with which the wafer is irradiated in the observation laser beam irradiation step in the back surface in the image taken in the imaging step.

Furthermore, in accordance with another aspect of the present invention, there is provided a processing method of a wafer in which a modified layer is formed inside the wafer on which a plurality of planned dividing lines are set on a front surface along the planned dividing lines of the wafer. The processing method includes a holding step of causing the front surface of the wafer to be opposed to a chuck table and holding the wafer by the chuck table and a modified layer forming step of positioning a focal point of a first laser beam with a wavelength having transmissibility with respect to the wafer to the inside of the wafer and executing irradiation with the first laser beam along the planned dividing lines from the side of a back surface of the wafer while relatively moving a laser beam irradiation unit and the chuck table in a direction along the planned dividing line, to form the modified layer inside the wafer. The processing method includes also an observation laser beam irradiation step of positioning a focal point of a second laser beam with output power that does not exceed a processing threshold of the wafer and with a wavelength having transmissibility with respect to the wafer to the inside or the front surface of the wafer and executing irradiation with the second laser beam from the side of the back surface of the wafer after the modified layer forming step, an imaging step of imaging reflected light of the second laser beam with which the irradiation is executed in the observation laser beam irradiation step by an imaging unit, and a determination step of determining a processing state of the wafer on the basis of an image taken in the imaging step. The second laser beam with which the wafer is irradiated in the observation laser beam irradiation step travels to the inside of the wafer from a direction that is not perpendicular to the back surface of the wafer.

Preferably, the second laser beam is made incident on the wafer in the state in which aberration attributed to a lens that forms the focal point is corrected in the observation laser beam irradiation step.

Furthermore, preferably, the first laser beam and the second laser beam have the same light source.

Moreover, preferably, the observation laser beam irradiation step is executed in liquid immersion.

In the processing method of a wafer according to the aspect of the present invention, after the modified layer forming step of focusing the first laser beam on the inside of the wafer and forming the modified layer is executed, the observation laser beam irradiation step, the imaging step, and the determination step are executed. The second laser beam that is applied to the back surface side of the wafer in this observation laser beam irradiation step and travels inside the wafer is reflected by the front surface of the wafer and the crack that extends from the modified layer to the front surface side. Furthermore, in the imaging step, the reflected light of this second laser beam is imaged.

Here, in the observation laser beam irradiation step, the second laser beam (reflected light) travels in a region between the modified layer and the front surface. Here, if the crack that reaches the front surface of the wafer from the modified layer is not formed, the second laser beam travels in this region as it is. On the other hand, if the crack is formed, an interface is generated between a layer of air that enters this crack and the wafer and the second laser beam is reflected by this interface across which the difference in the refractive index between both sides is large. For this reason, the shape of the reflected light that appears in the image obtained in the imaging step changes depending on whether or not the crack exists. In other words, the processing state of the wafer regarding the presence or absence, position, shape, and so forth of the crack formed inside the wafer can be determined from the shape of the reflected light that appears in the image. At this time, the wafer does not need to be moved from the chuck table of the laser processing apparatus and it is possible to determine whether or not the crack that reaches the front surface of the wafer from the modified layer is formed without a pause after the modified layer is formed.

Therefore, by the aspect of the present invention, a processing method of a wafer in which whether or not the wafer has been properly processed can be easily checked is provided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
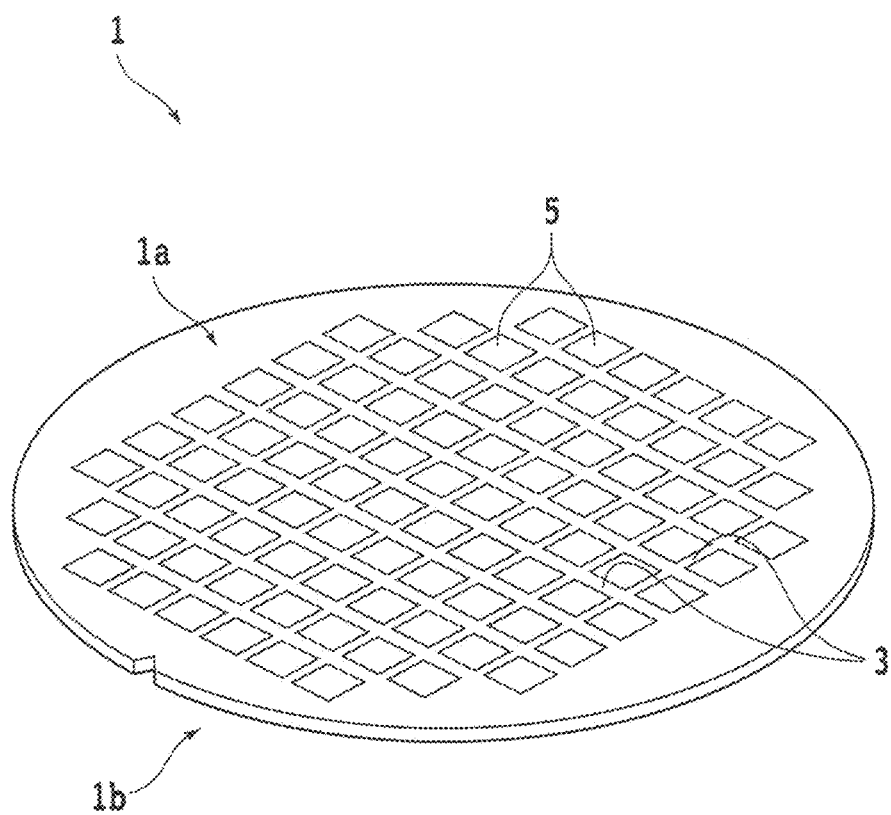
FIG. 1 is a perspective view schematically illustrating a wafer.

An embodiment of the present invention will be described with reference to the accompanying drawings. First, a wafer in which a modified layer is formed by a processing method of a wafer according to the present embodiment will be described. FIG. 1 is a perspective view schematically illustrating a wafer 1. The wafer 1 is a substrate or the like that has a substantially circular disc shape and is composed of a material such as silicon (Si), silicon carbide (SiC), gallium nitride (GaN), gallium arsenide (GaAs), or another semiconductor or a material such as sapphire, glass, or quartz, for example. This glass is alkali glass, non-alkali glass, soda-lime glass, lead glass, borosilicate glass, quartz glass, or the like, for example. Plural planned dividing lines 3 that intersect each other are set on a front surface 1a of the wafer 1. The planned dividing line 3 is referred to also as a street. On the front surface 1a of the wafer 1, a device 5 is formed in each of regions marked out by the planned dividing lines 3. The device 5 is an integrated circuit (IC), a large-scale integrated circuit (LSI), or the like, for example. However, the wafer 1 is not limited thereto. There is no limit on the material, shape, structure, size, and so forth of the wafer 1 and the devices 5 do not have to be formed on the wafer 1.

When the wafer 1 is divided along the planned dividing lines 3, individual device chips on each of which the device 5 is mounted are formed. When the wafer 1 is divided, for example, a laser beam is focused inside the wafer 1 along the planned dividing lines 3 and a modified layer is formed inside the wafer 1. In addition, a crack that extends from this modified layer toward the front surface 1a of the wafer 1 along the thickness direction is formed. At this time, if the processing condition of the wafer 1 is not proper and the state of a laser processing apparatus is also not a state suitable for processing, the crack does not extend from the modified layer or the crack extends in a direction that is not planned, or the like, and it is impossible to properly divide the wafer 1. In this case, a defective product is caused and therefore the yield of the device chips lowers.

Figure 2:
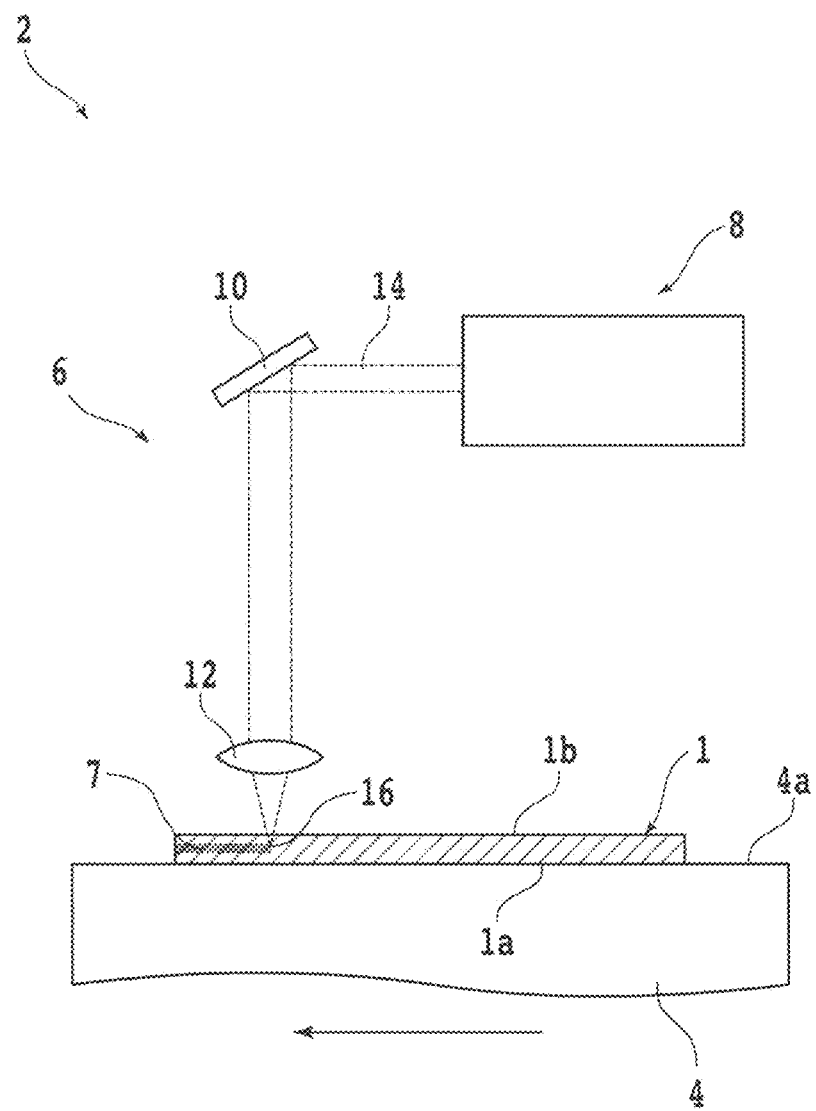
FIG. 2 is a sectional view schematically illustrating a modified layer forming step.

Next, a laser processing apparatus 2 with which the processing method of the wafer 1 according to the present embodiment is executed will be described by using FIG. 2 and so forth. FIG. 2 is a sectional view schematically illustrating how a modified layer is formed in the wafer 1 by using the laser processing apparatus 2. The laser processing apparatus 2 has a chuck table 4 that holds the wafer 1 and a laser beam irradiation unit 6 that irradiates the wafer 1 held by the chuck table 4 with a laser beam. The chuck table 4 has a porous component (not illustrated) on the upper surface side. The upper surface of the porous component serves as a holding surface 4a that holds the wafer 1. The chuck table 4 can rotate around an axis perpendicular to the holding surface 4a. The chuck table 4 has a suction source (not illustrated) connected to the porous component.

When the wafer 1 is processed by the laser processing apparatus 2, the front surface 1a is made opposed to the holding surface 4a and the wafer 1 is placed on the holding surface 4a. Next, a negative pressure generated by the suction source is made to act on the wafer 1 through the porous component. In this state, the wafer 1 is sucked and held by the chuck table 4 in the state in which the side of a back surface 1b is exposed upward. The wafer 1 is irradiated with a laser beam from the side of the exposed back surface 1b and is subjected to laser processing.

When the chuck table 4 is caused to hold the wafer 1, a frame unit obtained by integrating an annular frame, an adhesive tape whose periphery is stuck to this annular frame, and the wafer 1 may be formed in advance. When the frame unit is formed, the side of the front surface 1a of the wafer 1 is stuck to an adhesive surface of the adhesive tape exposed in the opening of this annular frame. In this case, when the chuck table 4 is caused to hold the frame unit, the wafer 1 is placed over the holding surface 4a with the intermediary of this adhesive tape.

The chuck table 4 and the laser beam irradiation unit 6 can relatively move in directions parallel to the holding surface 4a. For example, the chuck table 4 can move in a processing feed direction (X-axis direction) set to a direction parallel to the holding surface 4a and the laser beam irradiation unit 6 can move in an indexing feed direction (Y-axis direction) that is parallel to the holding surface 4a and is orthogonal to this processing feed direction.

In FIG. 2, the simplest configuration example of the laser beam irradiation unit 6 that can irradiate the wafer 1 held by the chuck table 4 with a laser beam is schematically illustrated. The laser beam irradiation unit 6 includes a laser oscillator 8 that oscillates a laser, a mirror 10, and a collecting lens 12.

The laser oscillator 8 has a function of emitting a first laser beam 14 with a wavelength having transmissibility with respect to the wafer 1 (such a wavelength as to be transmitted through the wafer 1). For example, a laser that is oscillated with use of Nd: YAG or the like as a medium and has a wavelength of 1099 nm is used as the first laser beam 14. However, the laser oscillator 8 and the first laser beam 14 are not limited thereto and are selected depending on the material of the wafer 1 and so forth. When the modified layer is formed inside the wafer 1, the output power of the first laser beam 14 is set to approximately 2 to 3 W, for example. However, the output power of the first laser beam 14 is not limited thereto and it suffices that the first laser beam 14 has output power with which the modified layer can be formed inside the wafer 1. The first laser beam 14 emitted from the laser oscillator 8 is reflected into a predetermined direction by the mirror 10 and goes through the collecting lens 12 to be applied to the wafer 1 held by the chuck table 4.

The collecting lens 12 has a function of focusing the first laser beam 14 on a predetermined height position inside the wafer 1 held by the chuck table 4. For example, the collecting lens 12 can move along the height direction and change the height position of a focal point 16. The focal point 16 of the first laser beam 14 is positioned to the predetermined height position inside the wafer 1. As illustrated in FIG. 2, when the first laser beam 14 is focused on the inside of the wafer 1 while the laser beam irradiation unit 6 and the chuck table 4 are relatively moved along the processing feed direction, a modified layer 7 is formed inside the wafer 1. Here, if the processing conditions such as the irradiation condition of the first laser beam 14 and the processing feed rate are properly set, a crack 9 that extends from the modified layer 7 to the front surface 1a of the wafer 1 is formed as illustrated in FIG. 3B and it becomes possible to divide the wafer 1 easily and properly.

Figure 3A:
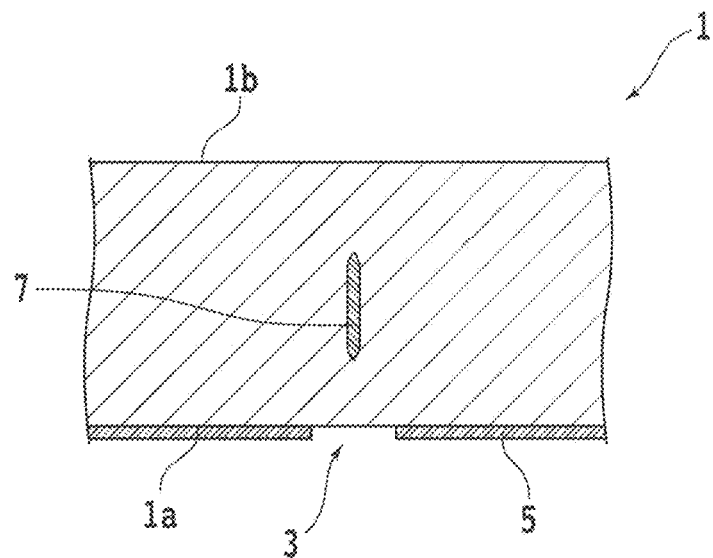
FIG. 3A is an enlarged sectional view schematically illustrating the wafer inside which a modified layer is formed.
Figure 3B:
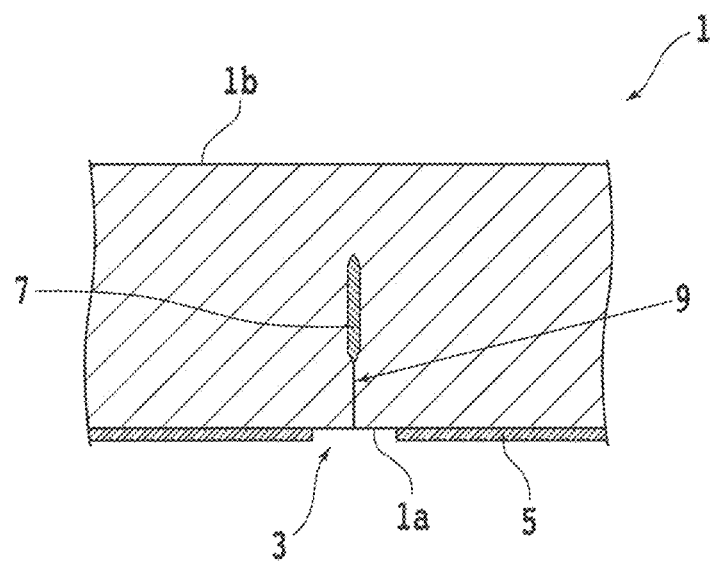
FIG. 3B is an enlarged sectional view schematically illustrating the wafer inside which the modified layer and a crack are formed.

However, if these processing conditions or the like are not proper, as illustrated in FIG. 3A, the crack 9 does not properly extend from the formed modified layer 7 or the crack 9 extends in a direction that is not planned, or the like, and it is impossible to properly divide the wafer 1. Therefore, the yield of the device chips lowers. Here, it is conceivable that the front surface 1a of the wafer 1 is observed by a microscope or the like, for example, in order to check whether or not the processing conditions or the like are proper, i.e., whether or not the crack 9 properly progresses from the modified layer 7 toward the front surface 1a of the wafer 1. However, to observe the side of the front surface 1a of the wafer 1 irradiated with the first laser beam 14 from the side of the back surface 1b, for example, the wafer 1 needs to be taken out from the laser processing apparatus 2 and be carried in to the microscope or the like with the wafer 1 turned upside down. For this reason, there is a problem that man-hours are required for the check of the processing state such as whether or not the crack 9 exists. Thus, in the processing method of a wafer according to the present embodiment, the man-hours of the check are reduced through checking the processing state of the wafer 1 in the laser processing apparatus 2. Next, a configuration used for the check of the processing state will be described.

Figure 4:
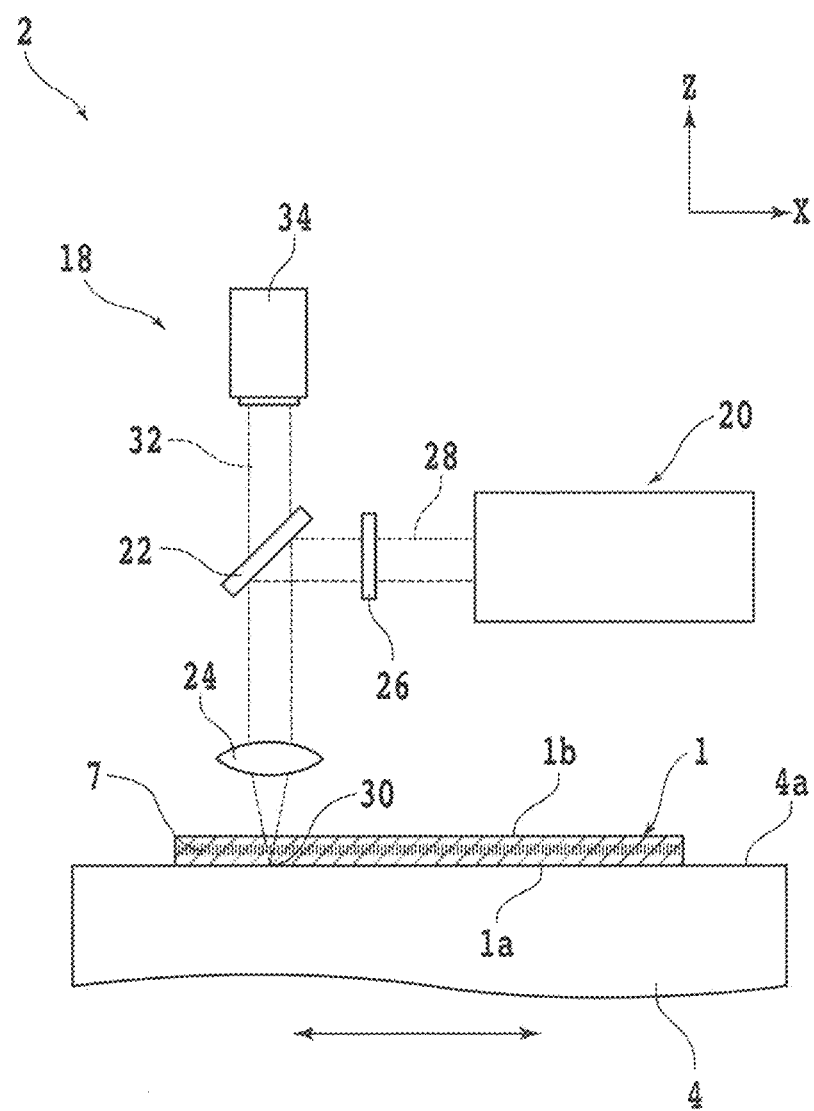
FIG. 4 is a sectional view schematically illustrating an observation laser beam irradiation step.

As illustrated in FIG. 4, the laser processing apparatus 2 includes an observation laser beam irradiation unit 18. The observation laser beam irradiation unit 18 has a function of irradiating the wafer 1 in which the modified layer 7 is formed with a second laser beam 28 that is a laser beam for observation. In FIG. 4, the simplest configuration example of the observation laser beam irradiation unit 18 that can irradiate the wafer 1 held by the chuck table 4 with the second laser beam 28 is schematically illustrated. The observation laser beam irradiation unit 18 includes a laser oscillator 20, a dichroic mirror 22, a collecting lens 24, and a beam shaping unit 26 that forms the shape of the second laser beam 28 into a specific shape. The laser oscillator 20 can emit the second laser beam 28 with output power that allows formation of the modified layer inside the wafer 1 and does not exceed a processing threshold.

The laser oscillator 20 emits the second laser beam 28 with output power of approximately 0.2 W that does not exceed the processing threshold, for example. However, the output power of the second laser beam 28 is not limited thereto. The processing threshold differs depending on the material of the wafer 1 and therefore the output power of the second laser beam 28 is decided as appropriate so as not to exceed the processing threshold depending on the material of the wafer 1 processed. Preferably, the output power of the second laser beam 28 is set in a range of one tenth to one thousandth of the output power of the first laser beam 14. More preferably, the output power of the second laser beam 28 is set to approximately one thirtieth of the first laser beam 14.

The dichroic mirror 22 has a function of reflecting the second laser beam 28 into a predetermined direction. Furthermore, the dichroic mirror 22 has the following function as described later. Specifically, after the second laser beam 28 is reflected by the side of the front surface 1*a* of the wafer 1, when reflected light 32 thereof reaches the dichroic mirror 22, the dichroic mirror 22 allows transmission of this reflected light therethrough. The collecting lens 24 has a function of focusing the second laser beam 28 on the inside or the front surface 1*a* of the wafer 1 held by the chuck table 4. For example, the collecting lens 24 can move along the height direction and change the height position of a focal point 30.

Note that the observation laser beam irradiation unit 18 may be capable of irradiating the wafer 1 held by the chuck table 4 with the first laser beam 14 with output power that exceeds the processing threshold of the wafer 1. That is, the observation laser beam irradiation unit 18 may be capable of functioning as the laser beam irradiation unit 6 described with FIG. 2. In this case, the laser beam irradiation unit 6 can be omitted and the configuration of the laser processing apparatus 2 is simplified. Therefore, the light sources of the first laser beam 14 and the second laser beam 28 may be the same. On the other hand, in the case in which the laser processing apparatus 2 has both the laser beam irradiation unit 6 and the observation laser beam irradiation unit 18, the wafer 1 can be efficiently processed when the laser processing apparatus 2 includes yet another chuck table. For example, simultaneously with irradiation of one wafer 1 with the second laser beam 28, another wafer 1 can be irradiated with the first laser beam 14.

The beam shaping unit 26 included in the observation laser beam irradiation unit 18 has a function of forming the shape of the second laser beam 28 emitted from the laser oscillator 20 into a specific shape. For example, the beam shaping unit 26 is a plate-shaped component having a transmission window (not illustrated) with a shape corresponding to this specific shape and a blocking part (not illustrated) that blocks the second laser beam 28 around this transmission window. This transmission window is formed to penetrate the beam shaping unit 26. The beam shaping unit 26 is incorporated into the observation laser beam irradiation unit 18 while the orientation thereof is adjusted in such a manner that the penetration direction of the transmission window corresponds with the traveling direction of the second laser beam 28. When the second laser beam 28 reaches the beam shaping unit 26, part thereof passes through this transmission window and the remaining part is blocked by the blocking part, so that the second laser beam 28 is formed into the specific shape.

Alternatively, in the observation laser beam irradiation unit 18, a diffractive optical element (DOE) may be incorporated as the beam shaping unit 26. In this case, this DOE is designed and manufactured in such a manner that the second laser beam 28 can be formed into a predetermined shape. Moreover, in the observation laser beam irradiation unit 18, a spatial light modulator including a Liquid crystal on silicon (LCOS) element may be incorporated as the beam shaping unit 26.

In the processing method of a wafer according to the present embodiment, the second laser beam 28 is shaped in such a manner that the sectional shape thereof in a surface perpendicular to the traveling direction of the second laser beam 28 (for example, back surface 1*b*) becomes asymmetric across the modified layer 7 when the back surface 1*b* of the wafer 1 is irradiated with the second laser beam 28. For example, the sectional shape of the second laser beam 28 is set to a semicircular shape located on one side of two regions separated with the modified layer 7 being the boundary. The wafer 1 is irradiated with the second laser beam 28 from the side of the back surface 1*b* and the second laser beam 28 travels inside the wafer 1. Then, the second laser beam 28 that has reached the front surface 1*a* of the wafer 1 is reflected by the front surface 1*a* of the wafer 1. Thereafter, the reflected light 32 of the second laser beam 28 travels in the opposite direction inside the wafer 1 and travels from the back surface 1*b* to the external of the wafer 1.

The reflected light 32 of the second laser beam 28 goes through the collecting lens 24 and is converted to collimated light to be transmitted through the dichroic mirror 22. Furthermore, an imaging unit 34 that images the reflected light 32 is disposed on the traveling path of the reflected light 32 transmitted through the dichroic mirror 22. The imaging unit 34 includes an image sensor such as a complementary metal oxide semiconductor (CMOS) sensor or a charge coupled device (CCD) sensor, for example. The imaging unit 34 images the reflected light 32 and forms an image in which the reflected light 32 appears. As described later, determination of whether or not the crack 9 properly extends from the modified layer 7 formed inside the wafer 1 to the front surface 1*a* is executed based on the image formed through imaging of the reflected light 32 by the imaging unit 34.

Figure 11:
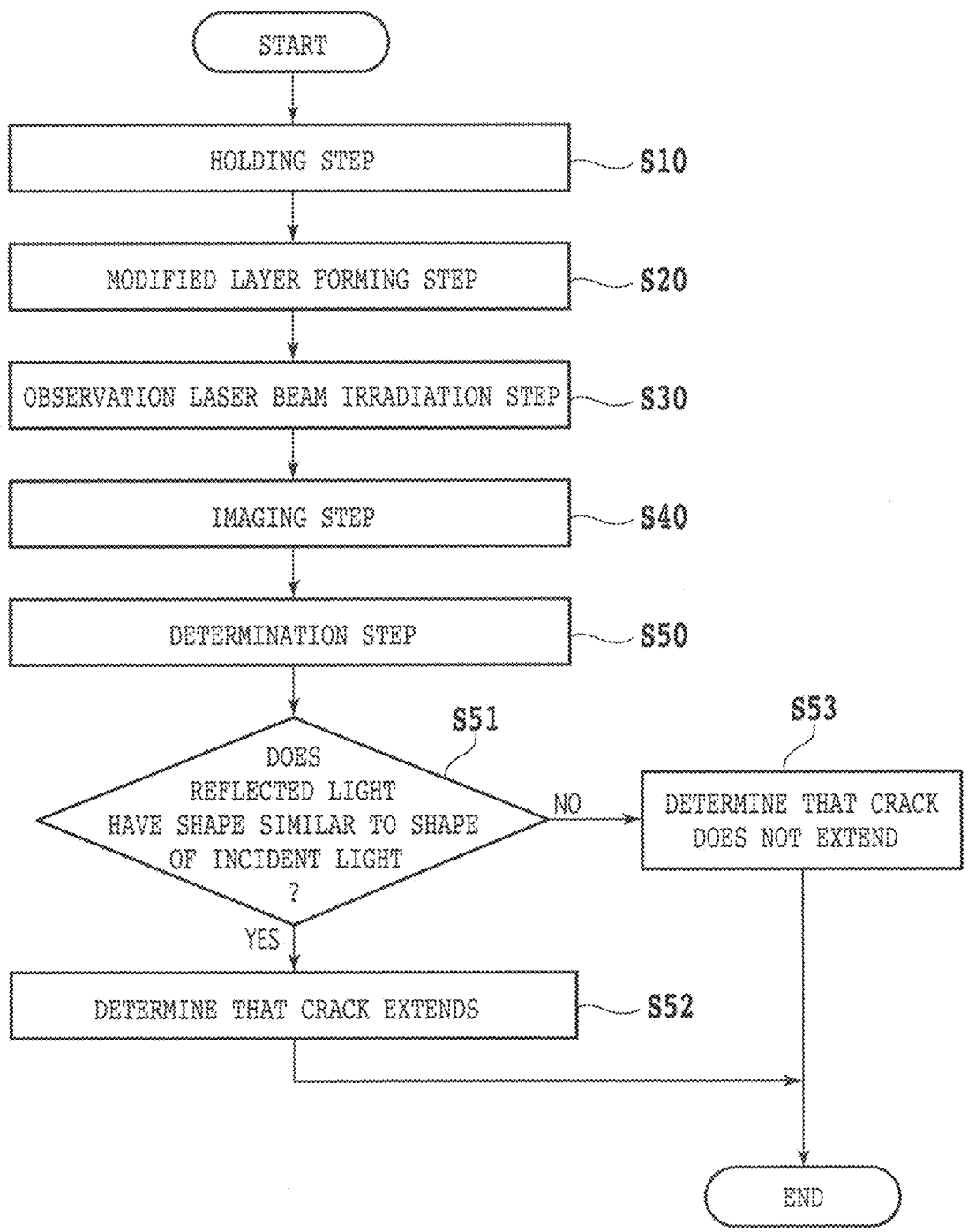
FIG. 11 is a flowchart illustrating the flow of the respective steps of a processing method of a wafer.

Next, the processing method of a wafer according to the present embodiment will be described. This processing method of a wafer is executed in the laser processing apparatus 2, for example. In the processing method of a wafer, the modified layer 7 is formed inside the wafer 1 along the plural planned dividing lines 3 of the wafer 1 for which these planned dividing lines 3 are set on the front surface 1*a*. In FIG. 11, a flowchart for explaining the flow of the respective steps of the processing method of a wafer is illustrated. The respective steps will be described in detail below.

First, a holding step S10 is executed in which the wafer 1 is carried in to the laser processing apparatus 2 and the front surface 1*a* of the wafer 1 is made opposed to the chuck table 4 and the wafer 1 is held by the chuck table 4. In the holding step S10, the wafer 1 is placed on the chuck table 4 in such a manner that the side of the front surface 1a of the wafer 1 is made opposed to the holding surface 4a of the chuck table 4 to cause the side of the back surface 1b of the wafer 1 to be exposed upward. Thereafter, when the suction source of the chuck table 4 is actuated to cause a negative pressure to act on the wafer 1, the wafer 1 is sucked and held by the chuck table 4. In FIG. 2, a sectional view of the wafer 1 sucked and held by the chuck table 4 is schematically illustrated. Note that, before the holding step S10 is executed, a protective component disposing step of sticking a protective component such as an adhesive tape to the front surface 1a of the wafer 1 may be executed in advance. In this case, the wafer 1 is held by the chuck table 4 with the intermediary of this protective component in the holding step S10.

Next, a modified layer forming step S20 is executed in which irradiation with the first laser beam 14 is executed along the planned dividing lines 3 from the side of the back surface 1b of the wafer 1 and the modified layer 7 is formed inside the wafer 1. The first laser beam 14 is a laser beam with a wavelength having transmissibility with respect to the wafer 1 (wavelength that allows transmission through the wafer 1). FIG. 2 is a sectional view schematically illustrating the modified layer forming step S20. In the modified layer forming step S20, first, the chuck table 4 and the laser beam irradiation unit 6 are relatively moved and one end of one planned dividing line 3 of the wafer 1 is positioned under the laser beam irradiation unit 6. Simultaneously, the chuck table 4 is rotated to align the planned dividing line 3 of the wafer 1 with the processing feed direction. Then, the focal point 16 of the first laser beam 14 is positioned to a predetermined height position inside the wafer 1.

Thereafter, the wafer 1 is irradiated with the first laser beam 14 while the chuck table 4 and the laser beam irradiation unit 6 are relatively moved in the processing feed direction. When the wafer 1 is irradiated with the first laser beam 14 under a condition appropriate for processing of the wafer 1, the modified layer 7 along the planned dividing line 3 is formed inside the wafer 1 and the crack 9 (see FIG. 3B and so forth) that extends from the modified layer 7 to the front surface 1a of the wafer 1 is formed. After the modified layer 7 is formed along the one planned dividing line 3 of the wafer 1, the chuck table 4 and the laser beam irradiation unit 6 are moved in the indexing feed direction and the modified layer 7 is similarly formed inside the wafer 1 along another planned dividing line 3. After the modified layer 7 is formed along all planned dividing lines 3 along the one direction, the chuck table 4 is rotated and the modified layer 7 is similarly formed along the planned dividing lines 3 along the other direction. When the irradiation with the first laser beam 14 has been executed along all planned dividing lines 3 of the wafer 1, the modified layer forming step S20 is completed. Note that, along each planned dividing line 3, irradiation with the first laser beam 14 may be executed two or more times with change in the height of the focal point 16 and plural modified layers 7 that overlap with each other may be formed.

When the wafer 1 inside which the modified layer 7 and the crack 9 that extends from the modified layer 7 are formed along the planned dividing lines 3 is ground from the side of the back surface 1b to thin the wafer 1 and remove the modified layer 7 and so forth, the wafer 1 is divided and individual device chips are obtained. However, if the crack 9 does not properly extend to the front surface 1a of the wafer 1, the wafer 1 cannot be properly divided, and the quality of the formed device chips does not meet the standards in some cases and damage to the device chip occurs in other cases. Thus, the yield of the device chips lowers.

FIG. 3A is an enlarged sectional view schematically illustrating the wafer 1 inside which the modified layer 7 is formed and the crack 9 is not formed. Furthermore, FIG. 3B is an enlarged sectional view schematically illustrating the wafer 1 inside which the modified layer 7 and the crack 9 that reaches the front surface 1a from the modified layer 7 are formed. If the crack 9 reaches the front surface 1a as illustrated in FIG. 3B, the crack 9 is visually recognized when the front surface 1a of the wafer 1 is observed by a microscope. On the other hand, if the crack 9 is not formed, the crack 9 cannot be visually recognized in the front surface 1a. Thus, it is conceivable that the side of the front surface 1a of the wafer 1 is observed by a microscope in order to check whether or not the crack 9 exists after the modified layer 7 is formed in the wafer 1. However, to observe the front surface 1a by the microscope, the wafer 1 needs to be carried out from the chuck table 4 and be moved to the microscope. Thus, in the processing method of a wafer according to the present embodiment, an observation laser beam irradiation step S30, an imaging step S40, and a determination step S50 are executed in order to determine whether or not the crack 9 that extends from the modified layer 7 to the front surface 1a exists.

Next, the observation laser beam irradiation step S30 executed after the modified layer forming step S20 will be described. In the observation laser beam irradiation step S30, the wafer 1 held by the chuck table 4 is irradiated with the second laser beam 28 as a laser beam for observation from the observation laser beam irradiation unit 18. The second laser beam 28 is a laser beam with output power that does not exceed the processing threshold of the wafer 1 and with a wavelength having transmissibility with respect to the wafer 1 (wavelength that allows transmission through the wafer 1). FIG. 4 is a side view schematically illustrating the observation laser beam irradiation step S30. When the wafer 1 inside which the modified layer 7 is formed is irradiated with the second laser beam 28 from the side of the back surface 1b, the focal point 30 is positioned to the inside or the front surface 1a of the wafer 1 in advance. Preferably, the focal point 30 is positioned to a position that overlaps with the modified layer 7 in the front surface 1a of the wafer 1.

The second laser beam 28 emitted from the laser oscillator 20 reaches the beam shaping unit 26 and is shaped into a predetermined shape by the beam shaping unit 26. Thereafter, the second laser beam 28 is reflected by the dichroic mirror 22 and travels toward the chuck table 4. Then, the second laser beam 28 is transmitted through the collecting lens 24 and thereafter is applied to the back surface 1b of the wafer 1 and travels inside the wafer 1 to be focused on the focal point 30. The second laser beam 28 that travels inside the wafer 1 is reflected by the front surface 1a of the wafer 1. Then, the reflected light 32 of the second laser beam 28 travels inside the wafer 1 and goes through the back surface 1b of the wafer 1 to travel to the external. Thereafter, the reflected light 32 is transmitted through the collecting lens 24 and the dichroic mirror 22 and reaches the imaging unit 34.

Figure 6A:
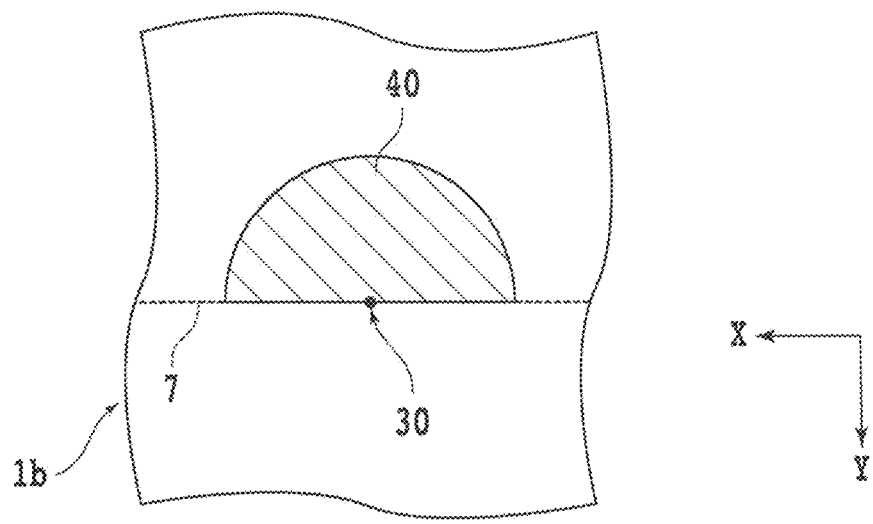
FIG. 6A is a plan view schematically illustrating a region irradiated with the second laser beam in a back surface of the wafer.

FIG. 6A is a plan view schematically illustrating one example of the sectional shape of the second laser beam 28 with which the wafer 1 is irradiated. Specifically, in FIG. 6A, a region 40 irradiated with the second laser beam 28 in the back surface 1b of the wafer 1 is illustrated and hatching lines are given to the region 40. Moreover, for convenience of explanation, dashed lines that schematically illustrate the planar position of the modified layer 7 formed inside the wafer 1 along the planned dividing line 3 and a point that schematically illustrates the planar position of the focal point 30 are displayed in FIG. 6A. As illustrated in FIG. 6A, the sectional shape of the second laser beam 28 is a semicircular shape, for example. As illustrated in FIG. 6A, the second laser beam 28 is shaped by the beam shaping unit 26 in advance in such a manner that the sectional shape thereof in a surface perpendicular to the traveling direction thereof (for example, back surface 1b of the wafer 1) becomes asymmetric across the modified layer 7.

Figure 5A:
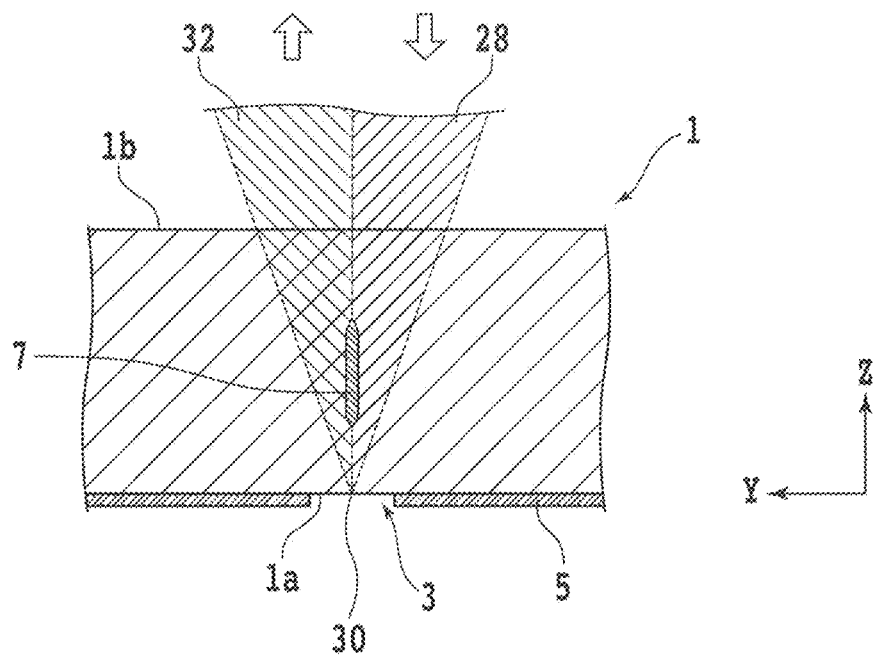
FIG. 5A is a sectional view schematically illustrating a second laser beam applied to the wafer inside which the modified layer is formed and reflected light thereof.
Figure 5B:
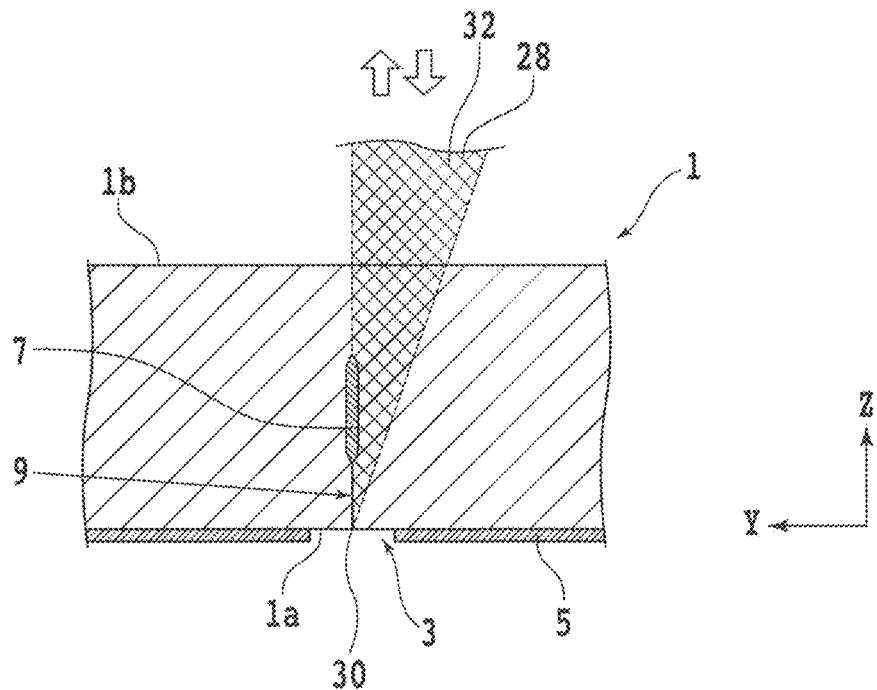
FIG. 5B is a sectional view schematically illustrating the second laser beam applied to the wafer inside which the modified layer and the crack are formed and the reflected light thereof.

Here, detailed description will be made about the path of the reflected light 32 of the second laser beam 28 reflected at the focal point 30 positioned to the front surface 1a of the wafer 1. FIG. 5A is a sectional view schematically illustrating the traveling path of the second laser beam 28 and the reflected light 32 in the case in which the crack 9 that extends from the modified layer 7 to the front surface 1a of the wafer 1 is not formed. FIG. 5B is a sectional view schematically illustrating the traveling path of the second laser beam 28 and the reflected light 32 in the case in which the crack 9 that extends from the modified layer 7 is formed. Note that the sectional view illustrated in FIG. 5A and the sectional view illustrated in FIG. 5B are drawings for explaining the influence of the presence and absence of the crack 9 on the reflected light 32. In the sectional view illustrated in FIG. 5A and the sectional view illustrated in FIG. 5B, characteristics such as the relative positional relation among the wafer 1, the modified layer 7, the planned dividing line 3, and the crack 9 and the angles at which the second laser beam 28 and the reflected light 32 travel are emphasized for convenience of explanation.

As illustrated in FIG. 5A and FIG. 5B, the second laser beam 28 with which the side of the back surface 1b of the wafer 1 is irradiated is focused on the focal point 30. Then, the second laser beam 28 is reflected by the front surface 1a of the wafer 1, and the reflected light 32 travels inside the wafer 1 and reaches the back surface 1b of the wafer 1. If the crack 9 that reaches the front surface 1a of the wafer 1 from the modified layer 7 is not formed inside the wafer 1, the second laser beam 28 passes through a region under the modified layer 7 and travels. As illustrated in FIG. 5A, the second laser beam 28 (incident light) and the reflected light 32 become the state of being inverted across the modified layer 7.

In contrast, if the crack 9 that reaches the front surface 1a of the wafer 1 from the modified layer 7 is formed inside the wafer 1, the second laser beam 28 reaches the crack 9 under the modified layer 7 and is affected by the crack 9. If the crack 9 reaches the front surface 1a of the wafer 1, the wafer 1 is slightly split by the crack 9 and therefore an interface is formed between a layer of air that enters the crack 9 and the wafer 1. For this reason, similarly to the reflection of the second laser beam 28 by the front surface 1a, the second laser beam 28 that has reached the crack 9 is reflected by the crack 9. In this case, as illustrated in FIG. 5B, the reflected light 32 reversely travels in the same region as the region inside the wafer 1 through which the second laser beam 28 (incident light) has been transmitted and reaches the front surface 1a of the wafer 1.

In the processing method of a wafer according to the present embodiment, next, the imaging step S40 of imaging the reflected light 32 of the second laser beam 28 with which the wafer 1 is irradiated in the observation laser beam irradiation step S30 by the imaging unit 34 is executed. In the imaging step S40, the reflected light 32 is imaged and an image in which the reflected light 32 appears is formed.

Figure 6B:
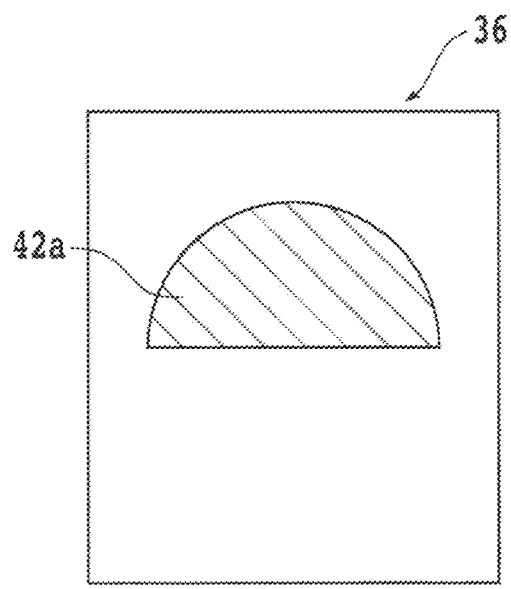
FIG. 6B is a plan view schematically illustrating one example of a region in which the reflected light appears in an image in which the reflected light appears.
Figure 6C:
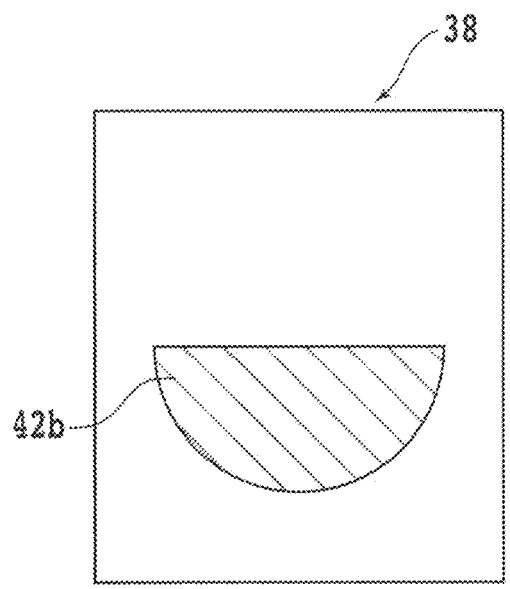
FIG. 6C is a plan view schematically illustrating another example of the region in which the reflected light appears in an image in which the reflected light appears.

FIG. 6C is a plan view schematically illustrating a region 42b in which the reflected light 32 appears in an image 38 formed through imaging by the imaging unit 34 in the case in which the crack 9 that reaches the front surface 1a from the modified layer 7 is not formed. If the crack 9 is not formed, as illustrated in FIG. 5A, the second laser beam 28 (incident light) and the reflected light 32 become the state of being inverted across the modified layer 7. Thus, the shape of the reflected light 32 of the second laser beam 28 that appears in the image 38 becomes such a shape as to be obtained by inverting the sectional shape of the second laser beam 28. When the sectional shape of the second laser beam 28 is a semicircular shape, the region 42b in which the reflected light 32 appears has a shape obtained by inverting this semicircular shape as illustrated in FIG. 6C.

Furthermore, FIG. 6B is a plan view schematically illustrating a region 42a in which the reflected light 32 appears in an image 36 formed through imaging by the imaging unit 34 in the case in which the crack 9 extends from the modified layer 7 to the front surface 1a. If the crack 9 extends from the modified layer 7 to the front surface 1a, as illustrated in FIG. 5B, the paths of the second laser beam 28 (incident light) and the reflected light 32 overlap. Thus, when the sectional shape of the second laser beam 28 is the semicircular shape, the region 42a in which the reflected light 32 appears has a shape similar to this semicircular shape as illustrated in FIG. 6B.

As above, the shape and so forth of the reflected light 32 that appears in the images 36 and 38 formed through imaging of the reflected light 32 in the imaging step S40 change depending on whether or not the crack 9 exists. Thus, on the basis of the images 36 and 38, whether or not the crack 9 that reaches the front surface 1a from the modified layer 7 is formed inside the wafer 1 can be determined.

In the processing method of a wafer according to the present embodiment, the determination step S50 of determining the processing state of the wafer 1 on the basis of the images 36 and 38 taken in the imaging step S40 is executed. Here, the processing state refers to the state of the wafer 1 processed by being irradiated with the first laser beam 14, for example, and includes the result of processing. For example, the processing state refers to the presence or absence of the crack 9 that reaches the front surface 1a from the modified layer 7. Details of the determination executed in the determination step S50 will be described. In the determination step S50, it is determined whether or not the shape of the reflected light 32 of the second laser beam 28 that appears in the image 36 or 38 taken in the imaging step S40 is a shape in which the sectional shape of the second laser beam 28 (incident light) with which the wafer 1 is irradiated is reflected. To put it simply, it is determined whether or not the reflected light 32 has a shape similar to the sectional shape of the incident light (S51). Here, the sectional shape of the second laser beam 28 refers to the shape of the region irradiated with the second laser beam 28 in the back surface 1b of the wafer 1, for example.

As a result, if it is confirmed that the reflected light 32 has a shape similar to the sectional shape of the incident light as illustrated in FIG. 6B, it is determined that the crack 9 extends from the modified layer 7 toward the side of the front surface 1a of the wafer 1 (S52). More specifically, if the reflected light 32 appears in the taken image in such a manner as to overlap with the region 42a with the same shape as the region irradiated with the second laser beam 28 (region 40 in FIG. 6A) in the back surface 1b, it is determined that the crack extends from the modified layer 7 toward the side of the front surface 1a of the wafer 1. On the other hand, if it is confirmed that the reflected light 32 has the shape obtained by inverting the sectional shape of the incident light as illustrated in FIG. 6C, it is determined that the crack 9 does not extend from the modified layer 7 toward the side of the front surface 1a of the wafer 1 (S53). Specifically, if the reflected light 32 appears in the relevant taken image in such a manner as to overlap with the region 42b with the shape obtained by inverting the region irradiated with the second laser beam 28 (region 40 in FIG. 6A) in the back surface 1b, it is determined that the crack 9 does not extend from the modified layer 7 toward the side of the front surface 1a of the wafer 1.

If it is determined that the crack 9 does not extend from the modified layer 7 to the front surface 1a in the determination step S50, it can be determined that the laser processing executed in the modified layer forming step S20 has not been properly executed. In this case, it is conceivable that the processing condition under which the wafer 1 is irradiated with the first laser beam 14 to process the wafer 1 in the modified layer forming step S20 is not proper or the laser processing apparatus 2 including the laser beam irradiation unit 6 involves some kind of abnormality. If it is determined that the crack 9 that extends to the front surface 1a is formed in the determination step S50, thereafter, for example, the wafer 1 is ground and thinned from the side of the back surface 1b and the wafer 1 is divided to manufacture individual device chips. If the crack 9 is properly formed, the wafer 1 is properly divided.

Figure 7A:
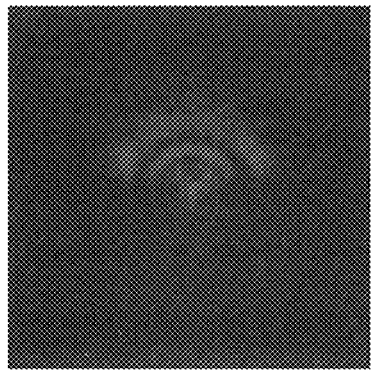
FIG. 7A and FIG. 7B are images in which the reflected light appears in the case in which the crack is formed in the wafer.
Figure 7B:
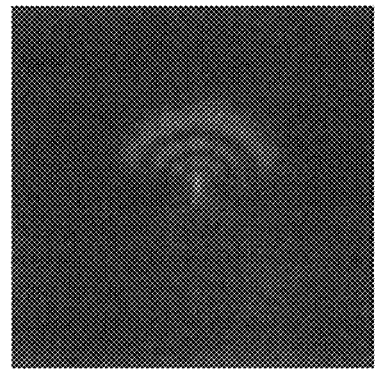
Figure 7C:
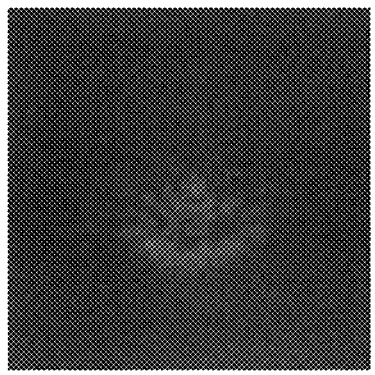
FIG. 7C and FIG. 7D are images in which the reflected light appears in the case in which the crack is not formed in the wafer.
Figure 7D:
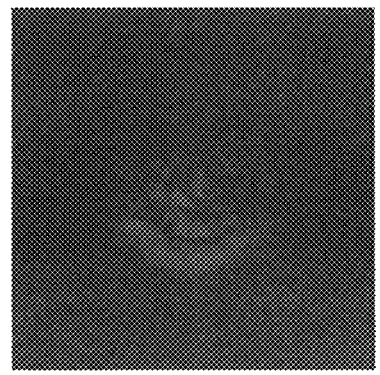

FIG. 7A and FIG. 7B are pictures illustrating one example of images taken by the imaging unit 34 when the crack 9 is formed in the wafer 1. Furthermore, FIG. 7C and FIG. 7D are pictures illustrating one example of images taken by the imaging unit 34 when the crack 9 is not formed in the wafer 1. In each picture, the reflected light 32 resulting from reflection of the second laser beam 28 by the front surface 1a of the wafer 1 appears in white. Furthermore, it is understood that the shape and the position of the reflected light 32 that appears in each picture can serve as the criterion of the determination of whether or not the crack 9 exists because the shape and the position of appearance of the reflected light 32 in the image change depending on whether or not the crack 9 is formed in the wafer 1. Note that, as is understood from each picture, the reflected light 32 does not necessarily appear with even intensity in the region in which the reflected light 32 appears. That is, the reflected light 32 is not necessarily distributed evenly in the whole of the region 42a illustrated in FIG. 6B or the whole of the region 42b illustrated in FIG. 6C. The reflected light 32 appears in a streak manner or in a spot manner in the image due to various causes attributed to an optical phenomenon and so forth. However, the determination of whether or not the crack 9 exists is sufficiently possible even when the reflected light 32 unevenly appears in the image.

In some cases, not only determining whether or not the crack 9 is formed inside the wafer 1 but also evaluating the quality of the crack 9 is desired. In the processing method of a wafer according to the present embodiment, the quality of the crack 9 may be evaluated from the image in which the reflected light 32 appears. For example, when meandering occurs in the crack 9 and minute recesses and projections exist on the reflective surface of the second laser beam formed by the crack 9, the image in which the reflected light 32 appears becomes unclear. Furthermore, part of the reflected light 32 appears outside the region in which the reflected light 32 is planned to appear in the image in some cases. Moreover, for example, if the crack 9 that extends from the modified layer 7 is short and the crack 9 does not reach the front surface 1a, a non-formation region of the crack 9 is often left between the modified layer 7 and the front surface 1a. In this case, part of the second laser beam 28 passes through this non-formation region and the other part thereof is reflected by the crack 9. That is, in some cases, in the image taken by the imaging unit 34, the reflected light 32 appears in both the region in which the reflected light 32 appears when the crack 9 is formed in the wafer 1 and the region in which the reflected light 32 appears when the crack 9 is not formed.

Figure 8A:
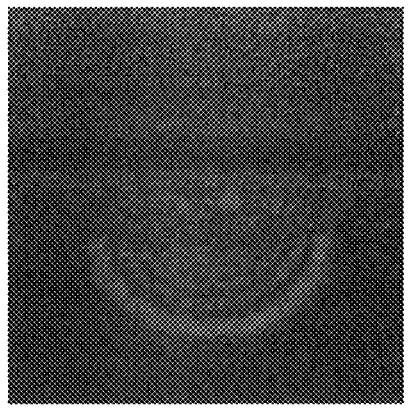
FIG. 8A, FIG. 8C, and FIG. 8E are images in which the reflected light appears.
Figure 8B:
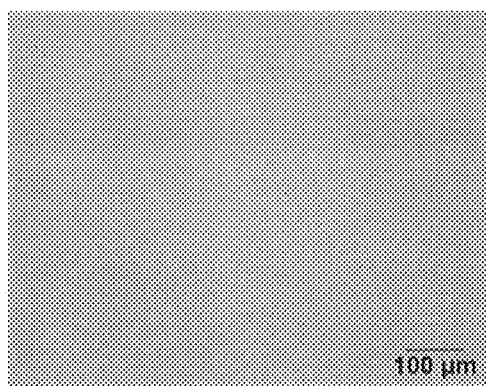
FIG. 8B, FIG. 8D, and FIG. 8F are optical micrographs in which a front surface of the wafer appears.
Figure 8C:
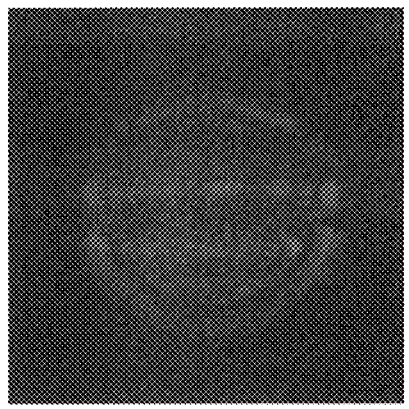
Figure 8D:
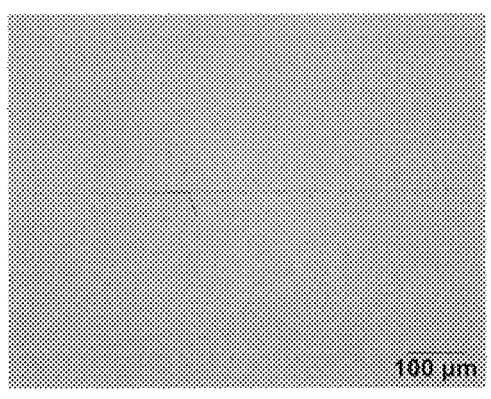
Figure 8E:
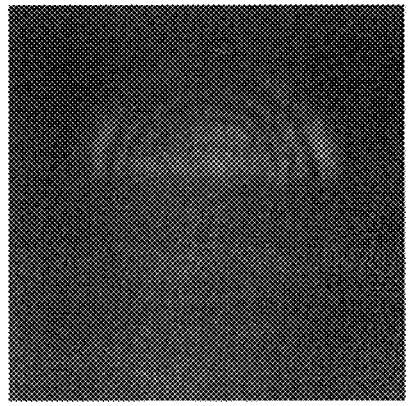
Figure 8F:
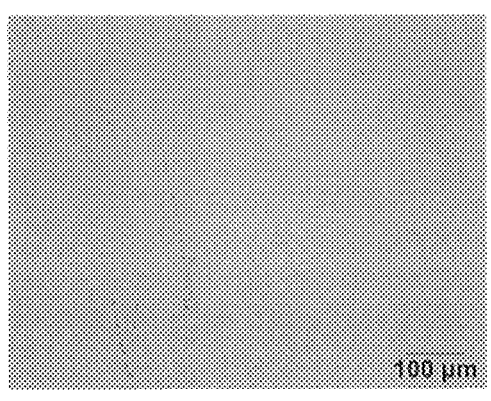

Further examples of the image obtained in the imaging step S40 will be depicted together with optical micrographs obtained by photographing the side of the front surface 1a of the wafer 1. FIG. 8A is an image in which the reflected light 32 appears, taken when the crack 9 is not formed from the modified layer 7 of the wafer 1 to the front surface 1a. FIG. 8B is an optical micrograph obtained by photographing the side of the front surface 1a of the same wafer 1. FIG. 8C is an image in which the reflected light 32 appears, taken when the crack 9 with insufficient quality is formed from the modified layer 7 of the wafer 1 to the front surface 1a. FIG. 8D is an optical micrograph obtained by photographing the side of the front surface 1a of the same wafer 1. Moreover, FIG. 8E is an image in which the reflected light 32 appears, taken when the crack 9 with sufficient quality is formed from the modified layer 7 of the wafer 1 to the front surface 1a. FIG. 8F is an optical micrograph obtained by photographing the side of the front surface 1a of the same wafer 1.

In the picture illustrated in FIG. 8F, an extremely-thin line that runs in the horizontal direction can be confirmed. If the crack 9 with little meandering and sufficient quality is formed in the wafer 1, the crack 9 is seen as such an extremely-thin line when the front surface 1a is observed by an optical microscope. An image obtained by executing the observation laser beam irradiation step S30 and the imaging step S40 in this case is illustrated in FIG. 8E. In contrast, a line that runs in the horizontal direction cannot be confirmed in the picture illustrated in FIG. 8B. That is, it is understood that the crack 9 that appears in the front surface 1a is not formed in the wafer 1. An image obtained by executing the observation laser beam irradiation step S30 and the imaging step S40 in this case is illustrated in FIG. 8A. It is understood that the shape and the position of the region in which the reflected light 32 appears are inverted from each other between the image illustrated in FIG. 8A and the image illustrated in FIG. 8E.

Furthermore, a line that runs in the horizontal direction can be confirmed in the picture illustrated in FIG. 8D. The line that appears in the picture illustrated in FIG. 8D is thicker than the extremely-thin line that appears in the FIG. 8F. If the crack 9 that involves meandering and has low quality is formed in the wafer 1, the crack 9 is seen as such a comparatively-thick line when the front surface 1a is observed by an optical microscope. An image obtained by executing the observation laser beam irradiation step S30 and the imaging step S40 in this case is illustrated in FIG. 8C. In the image illustrated in FIG. 8C, the reflected light 32 appears in both the region in which the reflected light 32 appears in the image illustrated in FIG. 8A and the region in which the reflected light 32 appears in the image illustrated in FIG. 8E. That is, it is considered that, when the image illustrated in FIG. 8C is taken, part of the second laser beam 28 passes through the region between the modified layer 7 and the front surface 1a and the other part of the second laser beam 28 is reflected by the crack 9. Thus, it can be determined that the quality of the crack 9 is insufficient. As above, in the processing method of a wafer according to the present embodiment, the quality of the crack 9 formed inside the wafer 1 may be evaluated from the image obtained by executing the imaging step S40.

Note that the shape and the position of the reflected light 32 that appears in the image obtained in the imaging step S40 are not limited thereto. For example, it is also conceivable that the reflected light 32 that appears in the image does not have the shape obtained by inverting the sectional shape of the incident light when the crack 9 is not formed in the wafer 1 depending on the focal position of the second laser beam 28 and the position at which the imaging unit 34 is disposed. For example, in some cases, the reflected light 32 that appears in the image has the shape obtained by inverting the sectional shape of the incident light when the crack 9 is formed. The influence of the presence or absence of the crack 9 on the position and the shape of the reflected light 32 that appears in the image differs for each system. Thus, in the case of attempting to determine whether or not the crack 9 that extends from the modified layer 7 to the front surface 1a exists from the image acquired in the imaging step S40, it is desirable to make verification about this influence in advance.

For example, it is desirable to execute the following process. The wafer 1 in which the crack 9 is formed in advance and the wafer 1 in which the crack 9 is not formed are prepared, and each wafer 1 is irradiated with the second laser beam 28 and the reflected light 32 is similarly imaged to obtain an image. Then, the influence of the presence or absence of the crack 9 on the image is evaluated and create a criterion for determining whether or not the crack 9 exists from the image. In the following, the description will be continued by taking as an example the case in which determination is executed based on whether the shape and the position of the reflected light 32 that appears in the image 36 or 38 are what reflect the sectional shape of the second laser beam 28 directly or what reflect the sectional shape through inversion. However, the method, criterion, and so forth of the determination are not limited thereto.

Here, description will be made about an experiment in which an investigation is made about influence given to whether or not formation of the crack 9 succeeds by the height position inside the wafer 1 regarding the focal point 16 on which the first laser beam 14 is focused when the modified layer forming step S20 is executed. In this experiment, Si wafers with a thickness of 775 μm are prepared as the wafers 1 and laser processing is executed by the laser processing apparatus 2. At this time, the wafer 1 is held by the chuck table 4 in the state in which the side of the back surface 1b of the wafer 1 is exposed upward and the wafer 1 is irradiated with the first laser beam 14 to form the modified layer 7 inside the wafer 1. In the present experiment, the respective Si wafers are irradiated with the first laser beam 14 under plural processing conditions different in the distance of the focal point 16 from the front surface 1a and plural wafers 1 different from each other in the formation depth of the modified layer 7 are created.

Then, each wafer 1 is irradiated with the second laser beam 28 and the reflected light 32 is imaged, and whether or not the crack 9 existed is determined from a formed image. Next, each wafer 1 is carried to a microscope and the side of the front surface 1a of the wafer 1 is observed to check whether or not the crack 9 existed. Furthermore, the relation among a depth D (height) of the modified layer 7 from the front surface 1a, the result of the determination of whether or not the crack 9 existed from the image, and the result of the check of whether or not the crack 9 existed by the microscope is depicted in Table 1.

TABLE 1

| Depth D (μm) from front surface | Whether or not crack existed | Result of determination on basis of image in which reflected light appeared |
|---|---|---|
| 57 | crack existed | crack existed |
| 61 | crack existed | crack existed |
| 65 | crack existed | crack existed |
| 69 | crack existed | crack existed |
| 73 | crack existed | crack existed |
| 77 | crack existed | crack existed |
| 81 | crack existed | crack existed |
| 86 | crack existed | crack existed |
| 90 | crack does not exist | crack does not exist |
| 94 | crack does not exist | crack does not exist |
| 98 | crack does not exist | crack does not exist |
| 102 | crack does not exist | crack does not exist |

As depicted in Table 1, in the present experiment, the depth D of the modified layer 7 from the front surface 1a is set to twelve depths from 57 to 102 μm and the modified layer 7 is formed in each wafer 1. Then, the wafer 1 is irradiated with the second laser beam 28 and the reflected light 32 is imaged to form the image. For example, FIG. 7A is an image formed when the depth D of the modified layer 7 from the front surface 1a is 81 μm and FIG. 7B is an image formed when the depth D is 86 μm. Furthermore, FIG. 7C is an image formed when the depth D is 90 μm and FIG. 7D is an image formed when the depth D is 94 μm.

In eight wafers 1 in which the depth D of the modified layer 7 from the front surface 1a is equal to or smaller than 86 μm, the shape of the reflected light 32 that appeared in the image is similar to the sectional shape of the second laser beam 28. On the other hand, in four wafers 1 in which the depth D of the modified layer 7 from the front surface 1a is equal to or larger than 90 μm, the shape of the reflected light 32 that appeared in the image is the shape obtained by inverting the sectional shape of the second laser beam 28. That is, it is suggested that the crack 9 that that reaches the front surface 1a from the modified layer 7 is formed when the depth D of the modified layer 7 is equal to or smaller than 86 μm.

Furthermore, in the present experiment, the wafer 1 is carried out from the laser processing apparatus 2 and the front surface 1a of each wafer 1 is observed by the microscope to check whether or not the crack 9 existed. Then, it is confirmed that the crack 9 is formed in the eight wafers 1 in which the depth D of the modified layer 7 is equal to or smaller than 86 μm as depicted in Table 1 and it is confirmed that the crack 9 is not formed in the four wafers 1 in which the depth D of the modified layer 7 is equal to or larger than 90 μm. In the present experiment, it is confirmed that the height of the modified layer 7 affects whether or not formation of the crack 9 that reaches the front surface 1a from the modified layer 7 succeeds. Moreover, in the present experiment, it is confirmed that the result of the determination of whether or not the crack 9 exists on the basis of the image in which the reflected light 32 appears completely corresponds to the result of the check of whether or not the crack 9 exists by the microscope and the processing state of the wafer 1 can be checked by the processing method of a wafer according to the present embodiment.

As described above, in the processing method of a wafer according to the present embodiment, without moving the wafer 1 from the chuck table 4 of the laser processing apparatus 2, whether or not the crack 9 exists can be easily determined in situ. That is, the processing state of the wafer 1 can be easily checked.

Note that the present invention is not limited to the description of the above-described embodiment and can be carried out with various changes. For example, with FIG. 2, the simplest configuration of the laser beam irradiation unit 6 has been described. Furthermore, with FIG. 4, the simplest configuration of the observation laser beam irradiation unit 18 has been described. Moreover, the case in which the light source of the first laser beam 14 is different from the light source of the second laser beam 28 has been mainly described. However, the processing method of a wafer according to the present embodiment is not limited thereto. For example, a laser beam irradiation unit of another form may be used in the modified layer forming step S20 and the observation laser beam irradiation step S30 in the processing method of a wafer according to the aspect of the present invention.

Figure 9:
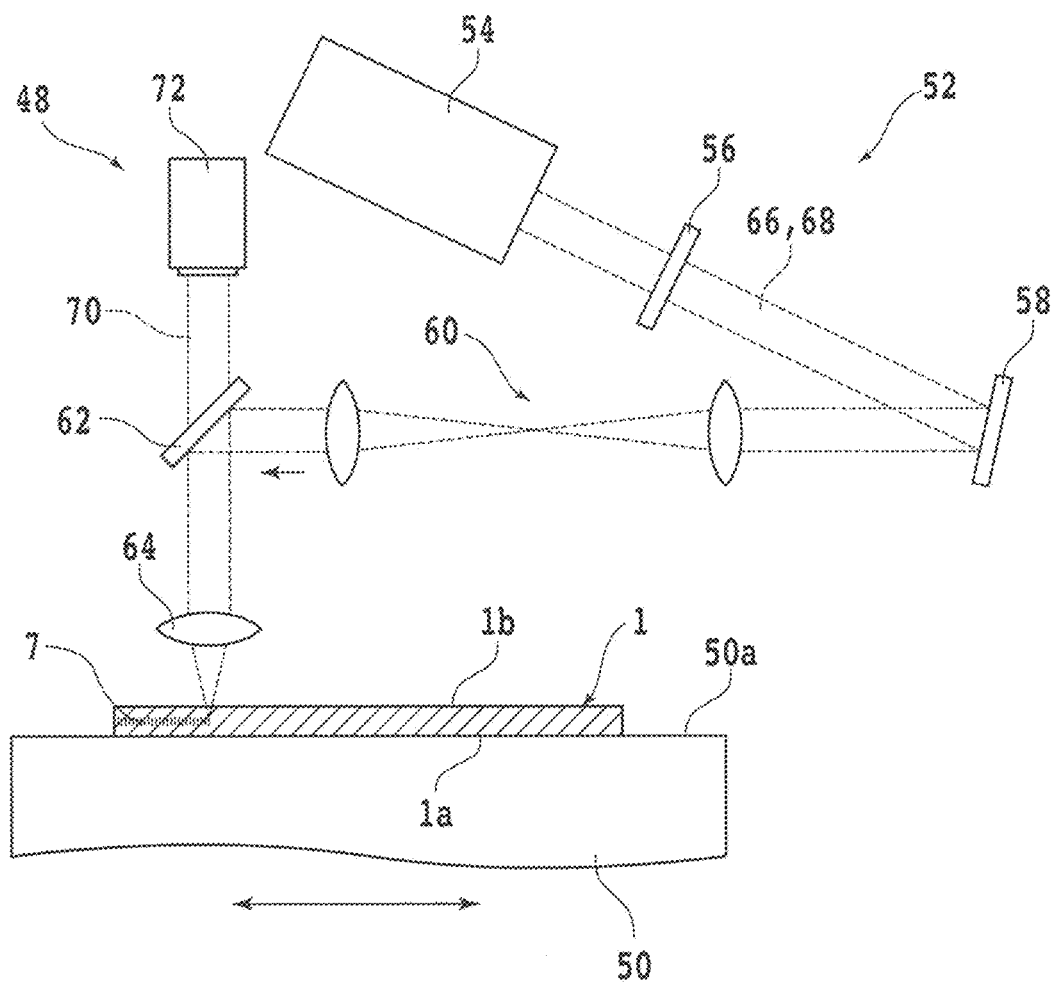
FIG. 9 is a sectional view schematically illustrating a modification example of the modified layer forming step and the observation laser beam irradiation step.

Next, a laser processing apparatus 48 that is a modification example of the laser processing apparatus 2 will be described. FIG. 9 is a side view schematically illustrating a laser beam irradiation unit 52 according to the modification example with which the laser processing apparatus 48 is equipped. The laser processing apparatus 48 includes a chuck table 50 including a holding surface 50a exposed upward and the laser beam irradiation unit 52. The chuck table 50 is configured similarly to the chuck table 4 of the laser processing apparatus 2. The laser beam irradiation unit 52 has a function of irradiating the wafer 1 with a laser beam with such a wavelength as to be transmitted through the wafer 1. Furthermore, the laser beam irradiation unit 52 can irradiate the wafer 1 with a first laser beam 66 with output power that exceeds a processing threshold and irradiate the wafer 1 with a second laser beam 68 with output power that does not exceed the processing threshold. That is, the laser beam irradiation unit 52 can be used for the modified layer forming step S20 and the observation laser beam irradiation step S30.

As illustrated in FIG. 9, the laser beam irradiation unit 52 includes a laser oscillator 54, a polarizer 56, a spatial light modulator 58, a 4f lens unit 60, a dichroic mirror 62, and a collecting lens 64. The laser oscillator 54, the dichroic mirror 62, and the collecting lens 64 are similar to the corresponding configurations of the above-described laser beam irradiation unit 6 and observation laser beam irradiation unit 18. Furthermore, the laser processing apparatus 48 includes an imaging unit 72 configured similarly to the imaging unit 34 near the laser beam irradiation unit 52.

The polarizer 56 is used in order to adjust the polarization direction of the laser beam incident on the spatial light modulator 58. Furthermore, the spatial light modulator 58 is an LCOS element, for example. When the LCOS element that functions as the spatial light modulator 58 is irradiated with the laser beam, this laser beam is reflected while being subjected to phase modulation by a liquid crystal, so that the wave surface shape can be controlled. That is, using the spatial light modulator 58 can shape the incident laser beam into a predetermined sectional shape. The 4f lens unit 60 disposed between the spatial light modulator 58 and the dichroic mirror 62 has a pair of lenses. Furthermore, the pair of lenses are separated from each other by a predetermined distance. Moreover, the distance between a respective of the lenses and the spatial light modulator 58 or the dichroic mirror 62 is also adjusted. That is, the pair of lenses of the 4f lens unit 60 configure a bi-telecentric optical system. Due to this, an image of the laser beam reflected by the reflective surface of the spatial light modulator 58 is formed on the incident surface of the collecting lens 64.

In the modified layer forming step S20, by the laser beam irradiation unit 52, the focal point of the first laser beam 66 is positioned to a predetermined height position inside the wafer 1 and the side of the back surface 1b of the wafer 1 is irradiated with the first laser beam 66. Thereby, the modified layer 7 along the planned dividing line 3 is formed inside the wafer 1. At this time, in the spatial light modulator 58, the incident first laser beam 66 is not shaped into a specific shape. Alternatively, the first laser beam 66 is shaped into a shape suitable for formation of the modified layer 7.

In the observation laser beam irradiation step S30, by the laser beam irradiation unit 52, the focal point of the second laser beam 68 is positioned to the front surface 1a or the inside of the wafer 1 and the side of the back surface 1b of the wafer 1 is irradiated with the second laser beam 68. At this time, the spatial light modulator 58 shapes the second laser beam 68 in such a manner that the sectional shape thereof in a surface perpendicular to the traveling direction thereof becomes asymmetric across the modified layer 7 when the back surface 1b of the wafer 1 is irradiated with the second laser beam 68. Thereafter, the second laser beam 68 travels inside the wafer 1 and is reflected by the front surface 1a. Then, reflected light 70 travels from the back surface 1b of the wafer 1 to the external of the wafer 1 and is transmitted through the dichroic mirror 62 to reach the imaging unit 72. The imaging unit 72 images the reflected light 70 and creates an image.

As above, when the laser beam irradiation unit 52 is used, the first laser beam 66 and the second laser beam 68 can be generated by a common light source and therefore the laser processing apparatus 48 is obtained as an apparatus having a simplified configuration.

Figure 10:
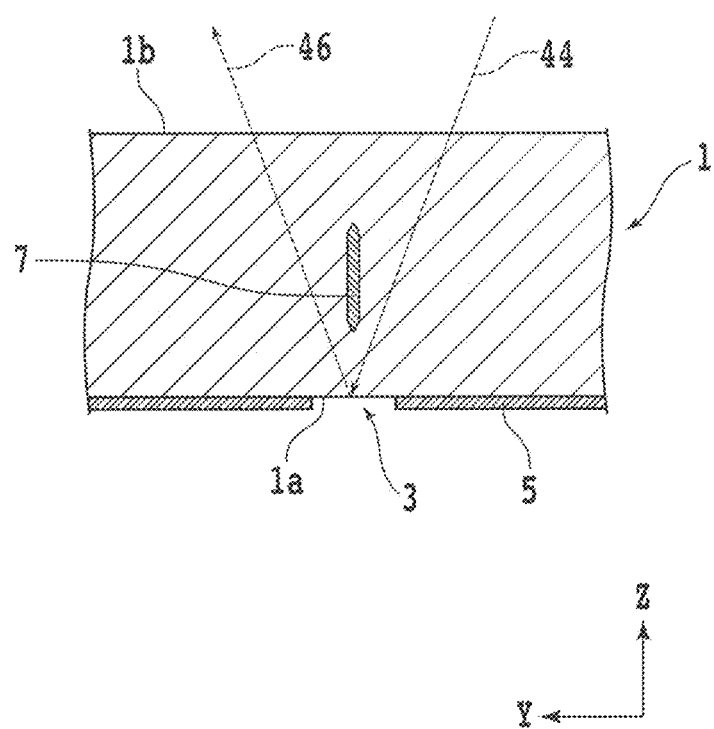
FIG. 10 is a sectional view schematically illustrating the wafer irradiated with a second laser beam from the traveling direction that is not perpendicular to the back surface of the wafer.

Moreover, in the above-described embodiment, description has been made about the case in which the sectional shape of the second laser beam 28 is asymmetric across the modified layer 7 and irradiation with the second laser beam 28 is executed from the normal direction of the back surface 1b of the wafer 1. However, the aspect of the present invention is not limited thereto. FIG. 10 is a sectional view schematically illustrating the case in which the traveling direction of a second laser beam 44 is not perpendicular to the back surface 1b of the wafer 1 in the observation laser beam irradiation step S30. As illustrated in FIG. 10, if the crack 9 that reaches the front surface 1a from the modified layer 7 is not formed, the second laser beam 44 (reflected light 46) travels in a region between the modified layer 7 and the front surface 1a. On the other hand, if the crack 9 that extends from the modified layer 7 to the front surface 1a exists, the second laser beam 44 (reflected light 46) is reflected by the crack 9.

As above, there is also the case in which whether or not the crack 9 exists can be determined from the image in which the reflected light 46 appears irrespective of whether or not the sectional shape of the second laser beam 44 is asymmetric. In this case, the second laser beam 44 with which the wafer 1 is irradiated in the observation laser beam irradiation step S30 is made to travel from a direction that is not perpendicular to the back surface 1b of the wafer 1 to the inside of the wafer 1. Furthermore, also in this case, change occurs in the image in which the reflected light 32 appears depending on whether or not the crack 9 exists. Thus, whether or not the crack 9 exists can be determined from the image in which the reflected light 32 appears.

Incidentally, in some cases, the second laser beam 28 with which the wafer 1 is irradiated is not precisely focused on the focal point 16 due to the influence of spherical aberration and the reflected light 32 does not clearly appear in the image obtained in the imaging step S40 as a result. Thus, a correction ring that alleviates the influence of the spherical aberration may be mounted on the collecting lens 24. Furthermore, in this case, the correction ring with appropriate performance according to the thickness and material of the wafer 1 is selected and used, for example. Alternatively, when a spatial light modulator such as an LCOS element is used for the observation laser beam irradiation unit 18, the second laser beam 28 about which the spherical aberration has been corrected may be formed and the back surface 1b of the wafer 1 may be irradiated with the second laser beam 28.

Moreover, the observation laser beam irradiation step S30 may be executed in liquid immersion. This case will be described with the observation laser beam irradiation step S30 illustrated in FIG. 4. A space between the collecting lens 24 and the back surface 1b of the wafer 1 is filled with a liquid. As this liquid, a liquid called immersion oil, glycerin, or purified water can be used, for example. In the case of executing the observation laser beam irradiation step S30 in liquid immersion, the numerical aperture of the collecting lens 24 that functions as an objective lens can be set high. Thus, the resolution of the image that is taken by the imaging unit 34 and in which the reflected light 32 appears can be enhanced and analysis can be executed in more detail regarding the crack 9 that extends from the modified layer 7.

Furthermore, in the above-described embodiment, description has been made mainly about the case in which the wafer 1 on which the devices 5 are formed on the side of the front surface 1a is irradiated with the first laser beam 14 and the second laser beam 28 from the side of the back surface 1b. However, the aspect of the present invention is not limited thereto. For example, the side of the front surface 1a of the wafer 1 may be irradiated with the first laser beam 14 and the second laser beam 28. Furthermore, laser processing of the wafer 1 on which the devices 5 are not formed may be executed and the modified layer 7 may be formed inside the wafer 1. Moreover, in the above-described embodiment, description has been made by taking as an example the case in which the sectional shape of the second laser beam 28 is a semicircular shape. However, this sectional shape is not limited thereto. For example, this sectional shape may be a triangular shape, a rectangular shape, or another polygonal shape. That is, it suffices that the distribution of the power is asymmetric across the modified layer 7. For example, if this sectional shape is a shape of half of a semicircle, information relating to the extension direction of the crack 9 is obtained from the image in which the reflected light 32 appears in some cases.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer in which a modified layer is formed inside the wafer on which a plurality of planned dividing lines are set on a front surface along the planned dividing lines of the wafer, the processing method comprising:

a holding step of causing the front surface of the wafer to be opposed to a chuck table and holding the wafer by the chuck table;

a modified layer forming step of positioning a focal point of a first laser beam with a wavelength having transmissibility with respect to the wafer to inside of the wafer and executing irradiation with the first laser beam along the planned dividing lines from a side of a back surface of the wafer while relatively moving a laser beam irradiation unit and the chuck table in a direction along the planned dividing line, to form the modified layer inside the wafer;

an observation laser beam irradiation step of positioning a focal point of a second laser beam with output power that does not exceed a processing threshold of the wafer and with a wavelength having transmissibility with respect to the wafer to the inside or the front surface of the wafer and executing irradiation with the second laser beam from the side of the back surface of the wafer after the modified layer forming step;

an imaging step of imaging reflected light of the second laser beam with which the irradiation is executed in the observation laser beam irradiation step by an imaging unit; and a determination step of determining a processing state of the wafer on a basis of an image taken in the imaging step, wherein the second laser beam with which the wafer is irradiated in the observation laser beam irradiation step is shaped in such a manner that a sectional shape of the second laser beam in a surface perpendicular to a traveling direction of the second laser beam becomes asymmetric across the modified layer.

2. The processing method of a wafer according to claim 1, wherein, in the determination step, it is determined that a crack extends from the modified layer toward a side of the front surface of the wafer when the reflected light appears in such a manner as to overlap with a region with a same shape as a region irradiated with the second laser beam with which the wafer is irradiated in the observation laser beam irradiation step in the back surface in the image taken in the imaging step, and it is determined that the crack does not extend from the modified layer toward the side of the front surface of the wafer when the reflected light appears in such a manner as to overlap with a region with a shape obtained by inverting a shape of the region irradiated with the second laser beam with which the wafer is irradiated in the observation laser beam irradiation step in the back surface in the image taken in the imaging step.

3. The processing method of a wafer according to claim 1, wherein the second laser beam is made incident on the wafer in a state in which aberration attributed to a lens that forms the focal point is corrected in the observation laser beam irradiation step.

4. The processing method of a wafer according to claim 1, wherein the first laser beam and the second laser beam have a same light source.

5. The processing method of a wafer according to claim 1, wherein the observation laser beam irradiation step is executed in liquid immersion.

6. A processing method of a wafer in which a modified layer is formed inside the wafer on which a plurality of planned dividing lines are set on a front surface along the planned dividing lines of the wafer, the processing method comprising:
- a holding step of causing the front surface of the wafer to be opposed to a chuck table and holding the wafer by the chuck table;
- a modified layer forming step of positioning a focal point of a first laser beam with a wavelength having transmissibility with respect to the wafer to inside of the wafer and executing irradiation with the first laser beam along the planned dividing lines from a side of a back surface of the wafer while relatively moving a laser beam irradiation unit and the chuck table in a direction along the planned dividing line, to form the modified layer inside the wafer;
- an observation laser beam irradiation step of positioning a focal point of a second laser beam with output power that does not exceed a processing threshold of the wafer and with a wavelength having transmissibility with respect to the wafer to the inside or the front surface of the wafer and executing irradiation with the second laser beam from the side of the back surface of the wafer after the modified layer forming step;
- an imaging step of imaging reflected light of the second laser beam with which the irradiation is executed in the observation laser beam irradiation step by an imaging unit; and
- a determination step of determining a processing state of the wafer on a basis of an image taken in the imaging step, wherein
- the second laser beam with which the wafer is irradiated in the observation laser beam irradiation step travels to the inside of the wafer from a direction that is not perpendicular to the back surface of the wafer.

* * * * *